United States Patent [19]

Sakakibara et al.

[11] Patent Number: 5,055,781
[45] Date of Patent: Oct. 8, 1991

[54] ROTATIONAL ANGLE DETECTING SENSOR HAVING A PLURALITY OF MAGNETORESISTIVE ELEMENTS LOCATED IN A UNIFORM MAGNETIC FIELD

[75] Inventors: Shinichi Sakakibara, Handa; Mamoru Matsubara, Toyoake, both of Japan

[73] Assignee: Aisan Kogyo Kabushiki Kaisha, Obu, Japan

[21] Appl. No.: 521,847

[22] Filed: May 10, 1990

[30] Foreign Application Priority Data

May 13, 1989 [JP] Japan .................................. 1-120115
May 13, 1989 [JP] Japan .................................. 1-120116
Aug. 21, 1989 [JP] Japan .................................. 1-214675

[51] Int. Cl.$^5$ ..................... H01L 43/08; G01R 33/06; G01B 7/30; G01P 3/44
[52] U.S. Cl. ........................... 324/207.21; 324/207.12; 324/207.25; 338/32 R; 307/309
[58] Field of Search .................. 324/207.12, 207.21, 324/252, 207.25; 338/32 R; 307/309

[56] References Cited

U.S. PATENT DOCUMENTS

| | | | |
|---|---|---|---|
| 4,392,375 | 7/1983 | Eguchi et al. | 324/207.21 |
| 4,506,217 | 3/1985 | Rothley et al. | 324/207.21 |
| 4,506,220 | 3/1985 | Sawada et al. | 324/252 |

FOREIGN PATENT DOCUMENTS

| | | |
|---|---|---|
| 59-41708 | 3/1984 | Japan . |
| 59-115304 | 8/1984 | Japan . |
| 62-81004 | 5/1987 | Japan . |
| 62-237302 | 10/1987 | Japan . |
| 63-42403 | 2/1988 | Japan . |

Primary Examiner—Walter E. Snow
Attorney, Agent, or Firm—Burns, Doane, Swecker & Mathis

[57] ABSTRACT

The invention is directed to an arrangement for detecting a rotational angle of a rotating shaft by a sensor. The sensor includes a substrate and a detecting element which has a plurality of blocks of magnetoresistance element deposited on a planar surface of the substrate. The sensor also includes a magneto member which has a pair of magnetic poles facing each side end of the substrate respectively and providing a magnetic field covering at least the planar surface of the substrate. The sensor is so arranged that one of the detecting element and the magneto member is mounted on the rotating shaft, and the other is disposed at a certain position relative to the rotating shaft. Accordingly, the blocks of magnetoresistance element are disposed always in a uniform magnetic field, so that the rotational angle is detected accurately.

8 Claims, 7 Drawing Sheets

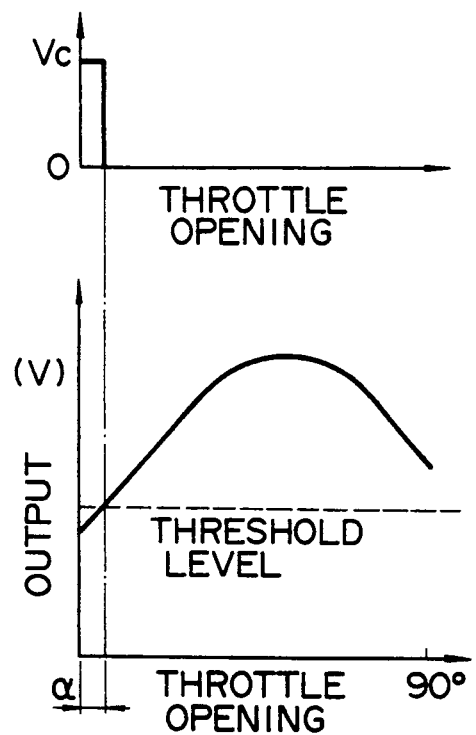
FIG. 16(a)
FIG. 16(b)
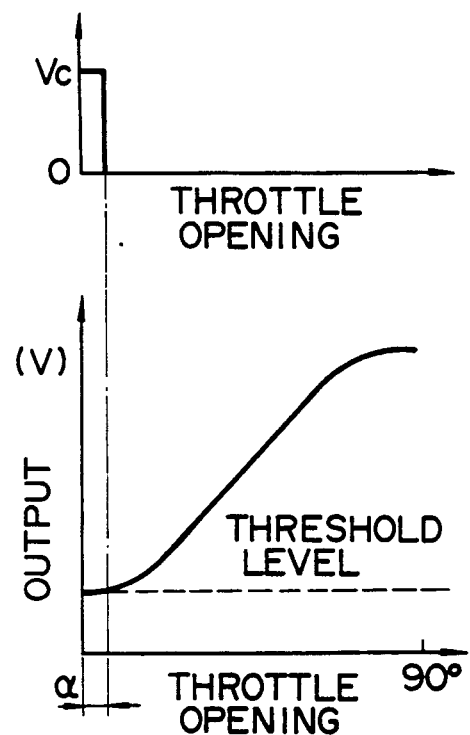
FIG. 17(a)
FIG. 17(b)

ROTATIONAL ANGLE DETECTING SENSOR HAVING A PLURALITY OF MAGNETORESISTIVE ELEMENTS LOCATED IN A UNIFORM MAGNETIC FIELD

BACKGROUND OF THE INVENTION

1. Field of the Invention

The present invention relates to a rotational angle sensor, and more particularly to a sensor having a magnetoresistance element for detecting a rotational angle of a rotating shaft.

2. Description of the Related Art

Recently, as to a sensor for detecting a rotational angle or a rotational position, it has been proposed to employ a magnetic sensor for providing a non-contact mechanism or reducing a loss of inertia of a shaft. For this magnetic sensor, used is a magnetoresistance element, a planar surface of which is disposed to face a permanent magnet mounted on the tip end of the shaft, for example.

As the magnetoresistance element, a semiconductor magnetoresistance element and a ferromagnetic magnetoresistance element are known. The former utilizes a property of a semiconductor whose electric resistance varies in a magnetic field. The latter utilizes a property of a ferromagnetic substance whose resistance varies anisotropically depending upon an angle defined by a magnetizing direction and a current direction in a magnetic field. This property of the ferromagnetic substance is called an anisotropic magnetoresistance effect, which is distinguished from a negative magnetoresistance effect in which its ohmic value varies depending upon the magnitude of the magnetic field. Namely, in an ordinal ferromagnetic substance, its ohmic value reaches the maximum when the current direction is parallel with the magnetizing direction, whereas it reaches the minimum when the current direction is perpendicular to the magnetizing direction, according to the anisotropic magnetoresistance effect. In order to make use of this effect, a ferromagnetic thin metal film is deposited on a planar surface of a substrate in a folded line fashion to constitute a ferromagnetic magnetoresistance element. Then, a magnetic sensor which includes the ferromagnetic magnetoresistance element as formed in the above is disposed on either an end face of a shaft or a position opposite to the end face, and a permanent magnet is disposed vis-a-vis, as disclosed in Japanese Patent Laid-open Publication No. 62237302, for instance.

However, in the case where the permanent magnet and the planar surface of the magnetoresistance element are arranged to face each other as disclosed in the above publication, a magnetic field applied on the magnetoresistance element is varied in response to the axial movement of the shaft. Although the ferromagnetic magnetoresistance element may operate in a relatively small magnetic field, this element will not operate, if it is positioned far away from the permanent magnet so that a sufficient magnetic flux is not applied to the element, thus will cause a measuring error. Therefore, the clearance between the planar surface of the magnetoresistance element and the permanent magnet should be maintained to be a certain distance. Accordingly, the shaft must be supported to prevent at least its axial movement, so that the support structure of the shaft is required to be precise and assembled accurately.

When the ferromagnetic magnetoresistance element is driven by a constant-current source or a constant-voltage source, its output is decreased substantially linearly with the increase of ambient temperature, since the ferromagnetic magnetoresistance element has a positive temperature coefficient, which is made smaller in case of using the constant-current source for driving the ferromagnetic magnetoresistance element than in case of using the constant-voltage source. Accordingly, two or four blocks of magnetoresistance elements are interconnected to form a bridge circuit, or other measures are taken, to avoid a fluctuation of the output due to a change in ambient temperature. Thus, in the magnetoresistance element including the above-described ferromagnetic magnetoresistance element, its output characteristic is varied due to the change in ambient temperature. Therefore, the temperature compensation is needed in the case where the ambient temperature, i.e., the externally environmental temperature is varied. In general, various electric circuit measures are provided in order to compensate for the output according to the change in ambient temperature. For instance, in Japanese Patent Laid-open Publication No. 63-42403, proposed is a temperature compensation circuit in which a series circuit of a temperature compensating diode and a resistor is interposed between a constant-current circuit for feeding a constant-current to a bridge of the magnetoresistance element and a constant-voltage circuit for driving the constant-current circuit, and an intermediate point of the series circuit is connected to the constant-current circuit. However, in the above-described temperature compensation circuit, an element different from the magnetoresistance element for detection is added for use of the temperature compensating element, so that both elements have their individual temperature characteristics respectively. Thus, if the element for detection and the element for compensation are different from each other in their temperature characteristics, these elements shall be coordinated each other. However, it is very difficult to stably perform the temperature compensation within the whole temperature range in measurement. Further, the element for compensation is to be selected individually and adjusted according to the change in ambient temperature under various conditions, so that increase of the cost will be caused.

In an internal combustion engine equipped with an electronic controlled fuel injection system, there is disposed a throttle position sensor whose output signal is used for fuel injection control. The throttle position sensor is connected to a throttle valve shaft, and for instance outputs a throttle opening angle signal which varies in response to a throttle valve opening angle (hereinafter simply referred to as a throttle opening) and an idle signal which is an ON or OFF signal depending on a condition of the engine in an idle region or an output region. As disclosed in Japanese Utility Model Laid-open Publication Nos. 59-41708, 59-115304 or 62-81004, it is common that the throttle opening signal is provided as an analogue voltage output proportional to the throttle opening, while the throttle opening signal may be an ON or OFF signal produced in response to the throttle opening. In the throttle position sensor, therefore, there is provided a potentiometer connected to the throttle valve as described in the above publications. Namely, a movable contact slides on a resistor in response to opening operation of the throttle valve to output a voltage between one end of the resistor and the movable contact. In closing operation of the throttle valve, a normally-open fixed contact for producing the idle signal is closed by another movable contact connected to the throttle valve to output an ON signal representing the idle region. Since the potentiometer has been employed in the prior throttle position sensor, the sliding movement between the resistor and the movable contact is necessary, that is the mechanical contact between the resistor and the movable contact is necessary. Accordingly, various measures should be taken to cope with the troubles caused by the mechanical contact such as wear or the like of the movable contact or the resistor. Among those measures, it is useful to employ a rotational angle sensor of a non-contact type for the throttle position sensor. While it is relatively easy for this sensor to detect the throttle opening, it is difficult to detect the idle region. Thus, separate switch means is necessitated, so that employment of the non-contact type is made rather insignificant. For instance, in the case where the magnetic sensor having the magnetoresistance element is employed, it is difficult to provide an accurate threshold level for the idle region, since the change in the output of the magnetic sensor is gentle in a region where the throttle opening, i.e., the rotational angle is small.

SUMMARY OF THE INVENTION

It is, therefore, an object of the present invention to provide a rotational angle sensor for detecting a rotational angle of a rotating shaft, which includes a magnetoresistance element which may be disposed always in a uniform magnetic field to obtain a stable detection efficiency irrespective of an ordinary displacement of the rotating shaft.

It is another object of the present invention to provide a rotational angle sensor which includes a magnetoresistance element and which may reduce an output fluctuation due to a change in ambient temperature to obtain a stable detection efficiency.

It is a further object of the present invention to provide a rotational angle sensor having a magnetoresistance element for detecting a rotational angle of a rotating shaft, wherein an effective threshold level may be provided even at an initial position of the rotating shaft.

It is yet a further object of the present invention to provide a rotational angle sensor which is applicable to a throttle position sensor for an internal combustion engine to detect not only a throttle opening but also an idle region easily and accurately.

In accomplishing these and other objects, a sensor for detecting a rotational angle of a rotating shaft comprises a substrate having a planar surface, a detecting element which includes a plurality of blocks of magnetoresistance element deposited on the planar surface of the substrate, and a magneto member which has a pair of magnetic poles facing each side end of the substrate respectively and providing a magnetic field covering at least the planar surface of the substrate. One of the detecting element and the magneto member is mounted on the rotating shaft, and the other thereof is disposed at a certain position relative to the rotating shaft. According to this rotational angle sensor, either one of the magneto member and the detecting element, for example the magneto member is mounted on the shaft. Then, the detecting element is disposed at a certain position relative to the shaft, so that a magnetic field including the planar surface of the substrate of the detecting element is provided between the magnetic poles of the magneto member. Accordingly, when the magnetic field is rotated in response to rotation of the shaft, an ohmic value of the magnetoresistance element on the substrate is varied according to the magnetoresistance effect. The rotational angle is, therefore, detected in response to the change in ohmic value of the magnetoresistance element.

The rotational angle sensor is preferably arranged to further include a constant-current circuit for feeding a constant-current to the bridge circuit of the detecting element, and a temperature compensating resistance element which includes a magnetoresistance element of the same material as said magnetoresistance element of the detecting element disposed in the vicinity thereof, and which adjusts a current fed to the constant-current circuit in response to a change in ohmic value of the temperature compensating resistance element varying in dependence on a change in ambient temperature. When the ohmic value of the magnetoresistance element of the detecting element varies in response to the change in ambient temperature, the ohmic value of the temperature compensating resistance element will vary in the same fashion as the detecting element, since the former is made of the same material as the latter. Accordingly, the current fed to the constant-current circuit is adjusted in response to the change in ohmic value of the temperature compensating resistance element, so that the fluctuation of the output of the detecting element due to the change in ambient temperature is avoided.

Further, the rotational angle sensor may be arranged such that the blocks of magnetoresistance element of the detecting element have a plurality of elongated sections arranged in parallel with and connected to each other respectively, with the elongated sections deflected by a certain angle from the direction of magnetic flux of the magnetic field provided by the magneto member at its initial position. This rotational angle sensor may be applied to a throttle position sensor, wherein the rotating shaft is connected to a throttle valve of an internal combustion engine and rotated in response thereto, and wherein the elongated sections of magnetoresistance element are arranged to be deflected from the direction of magnetic flux of the magnetic field provided by the magneto member when the throttle valve is in its closed position. In the case where the above-described sensor is applied to a throttle position sensor, a detecting element having a plurality of blocks of magnetoresistance element formed into a predetermined pattern shape is employed to detect an idle region where a throttle valve is substantially at its closed position. Namely, the elongated sections of the magnetoresistance element is deflected by a certain angle from the direction of magnetic flux of the magneto member at the closed position of the throttle valve. Accordingly, the output signal of the magnetoresistance element is made linear relative to the rotational angle of the shaft around the initial position of the shaft. Thus, the idle region is strictly defined within a predetermined throttle opening.

BRIEF DESCRIPTION OF THE DRAWINGS

The above stated objects and following description will become readily apparent with reference to the accompanying drawings, wherein like reference numerals denote like elements, and in which:

FIG. 16(a) is a diagram showing a characteristic of an idle signal in the case where a rotational angle sensor is used for a throttle position sensor according to the third embodiment of the present invention;

FIG. 16(b) is a diagram showing an output characteristic of a magnetoresistance element for detecting an idle region according to the third embodiment;

FIG. 17(a) is a diagram showing the characteristic of the idle signal when a magnetoresistance element for detecting a throttle opening is used for detecting the idle region according to the third embodiment;

FIG. 17(b) is a diagram showing the output characteristic of the magnetoresistance element for detecting the throttle opening according to the third embodiment;

DESCRIPTION OF THE PREFERRED EMBODIMENTS

Figure 1:
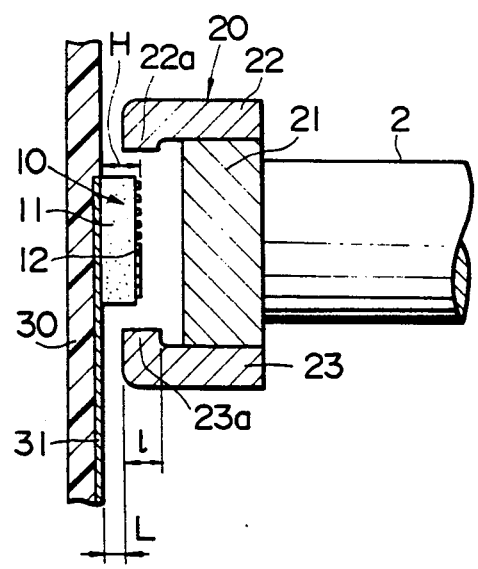
FIG. 1 is a sectional view of a part of a first embodiment of a rotational angle sensor according to the present invention.
Figure 2:
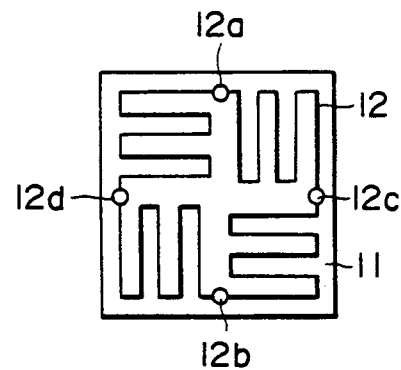
FIG. 2 is a plan view of a detecting element used for the rotational angle sensor of the first embodiment.
Figure 3:
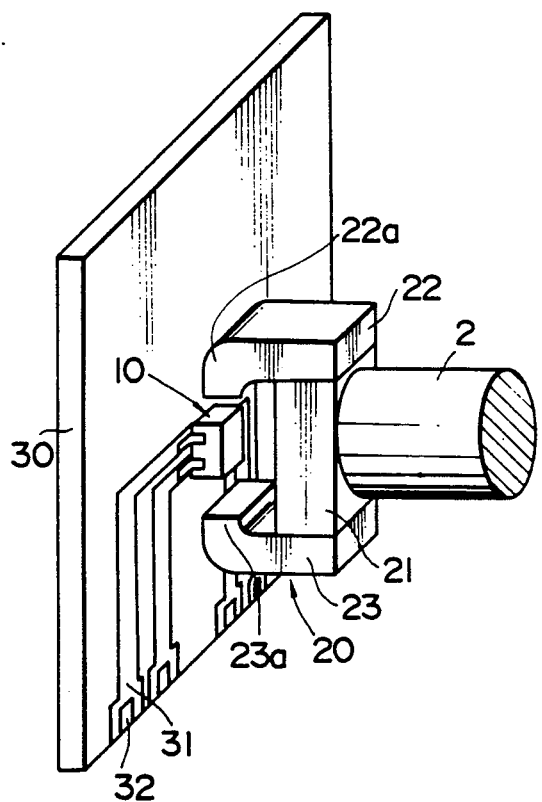
FIG. 3 is a perspective side view of the rotational angle sensor of first embodiment.

Referring to FIGS. 1 and 3, there is illustrated a rotational angle sensor of a first embodiment of the present invention, wherein a magnetic sensor 10 including a detecting element of the present invention is mounted on a circuit substrate 30 corresponding to a base plate of the present invention, and a magneto member 20 is disposed opposite thereto and mounted on a rotating shaft 2. As shown in FIGS. 1 and 2, the magnetic sensor 10 includes a detecting element 12 which is a thin film of magnetoresistance element of ferromagnetic alloy such as Ni-Co alloy deposited on an element substrate 11 such as a glass or the like. The ferromagnetic magnetoresistance element is formed by a technology for manufacturing an integrated circuit, such as vacuum deposition and photoetching, for example.

The ferromagnetic magnetoresistance element (hereinafter simply referred to as magnetoresistance element) constituting the detecting element 12 is formed into a pattern of a belt-like thin ferromagnetic alloy film which is folded to form a series of a letter S as shown in FIG. 2 so as to provide a high ohmic value. Besides, the magnetoresistance element is divided into a plurality of blocks in view of the magnetoresistance effect. Namely, the detecting element 12 is formed into a pattern configuration consisting of four blocks. Two blocks having mainly horizontal elongated sections and two blocks having mainly vertical elongated sections are alternately connected as shown in FIG. 2. At the connected points between the blocks next to each other, terminals 12a to 12d are formed respectively, and those blocks are formed into a bridge circuit. The terminals 12a, 12b are so-called current terminals, and the terminal 12a is connected to a constant-voltage power source (hereinafter simply referred to as power source) through a constant-current circuit which will be described later, while the terminal 12b is grounded. The terminals 12c, 12d are so-called voltage terminals, from which a detection signal is output. The terminals 12a to 12d are electrically connected to a plurality of leads 31 formed on the circuit substrate 30 as shown in FIG. 3. Components constituting a detection circuit which will be described later are mounted on the reverse side of the surface of the circuit substrate 30 on which the magnetic sensor 10 is disposed. The detecting element 12 is electrically connected to these components through the leads 31 and the terminals 32 which are connected to the corresponding leads 31.

As shown in FIG. 1, the magneto member 20 is disposed at a cirtain position from the magnetic sensor 10 and the circuit substrate 30. The magneto member 20 includes a permanent megnet 21 and a pair of substantially L-like magnetic arm members 22, 23 which are fixed to the permanent magnet 21, so that the magneto member 20 is formed into a letter of C as a whole. The shaft 2 is fixed to the permanent magnet 21 longitudinally in parallel with these magnetic arm members 22, 23. The magnetic arm members 22, 23 are respectively fixed to the sides of the permanent magnet 21 by means of bonding or the like such that the end faces of bent tip ends 22a, 23a are opposed to each other and a space is defined between the opposite end faces of the tip ends 22a, 23a. Thus, the magnetic arm members 22, 23 have at their tip ends 22a, 23a the N pole and S pole respectively, and a magnetic field of a parallel magnetic flux having a uniform flux density is formed between the poles. The distance between the tip ends 22a and 23a of the magnetic arm members 22 and 23 is set to be larger than the maximum length of the planar surface portion of the magnetic sensor 10. The clearance L between the tip ends 22a, 23a and the circuit substrate 30 is set to be smaller than the thickness H of the magnetic sensor 10. Whereas, each thickness 1 of the opposite end faces of the tip ends 22a, 23a is larger than the thickness H of the magnetic sensor 10. Therefore, even if the magneto member 20 closes to or departs from the magnetic sensor 10 in response to rotation of the shaft 2 depending upon a supporting structure of the shaft 2 or the like, the detecting element 12 is always positioned between the opposite end faces of the tip ends 22a, 23a, with the magneto member 20 positioned away from the circuit substrate 30 and also with the clearance L set to be smaller than the width H of the magnetic sensor 10.

Figure 4:
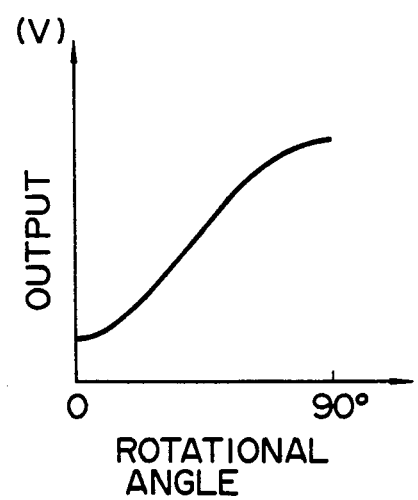
FIG. 4 is a diagram showing an output characteristic of the rotational angle sensor of the first embodiment.

Accordingly, the magnetic sensor 10 is located in the uniform parallel magnetic field formed between the tip ends 22a, 23a, with the planar surface of the element substrate 11 positioned in parallel with the magnetic field, so that the uniform magnetic flux parallel with the planar surface is applied to the magnetoresistance element constituting the detecting element 12. When the permanent magnet 21 rotates around the magnetic sensor 10 in response to rotation of the shaft 2, the magnetic filed between the tip ends 22a, 23a rotates so that an angle defined by the current direction and the magnetizing direction to the detecting element 12 varies. In this case, an ohmic value of the magnetoresistance element of the detecting element 12 reaches the maximum when the magnetizing direction of the magnetic field between the tip ends 22a, 23a and the direction of the current fed to the detecting element 12 are made parallel with each other, whereas the ohmic value reaches the minimum when both directions are made perpendicular to each other. Consequently, the output of the terminals 12c, 12d of the detecting element 12 results in a substantially sinusoidal wave to obtain a substantially linear characteristic of the output for a rotational angle of the shaft 2 except that in the region proximate to the maximum or minimum of the output, as shown in FIG. 4.

In the above-described rotational angle sensor, if the shaft 2 is displaced in the axial direction thereof due to the supporting structure of the shaft 2, or displaced in the parallel direction with the magnetic sensor 10 due to an offset of the shaft 2, the magneto member 20 will be displaced relative to the magnetic sensor 10. However, since the magnetic field formed between the tip ends 22a, 23a provides a uniform parallel magnetic flux, the magnetic flux applied to the detecting element 12 is not varied. Therefore, the stable voltage signal is output from the terminals 12c, 12d without being affected by the above displacement of the shaft 2.

Figure 5:
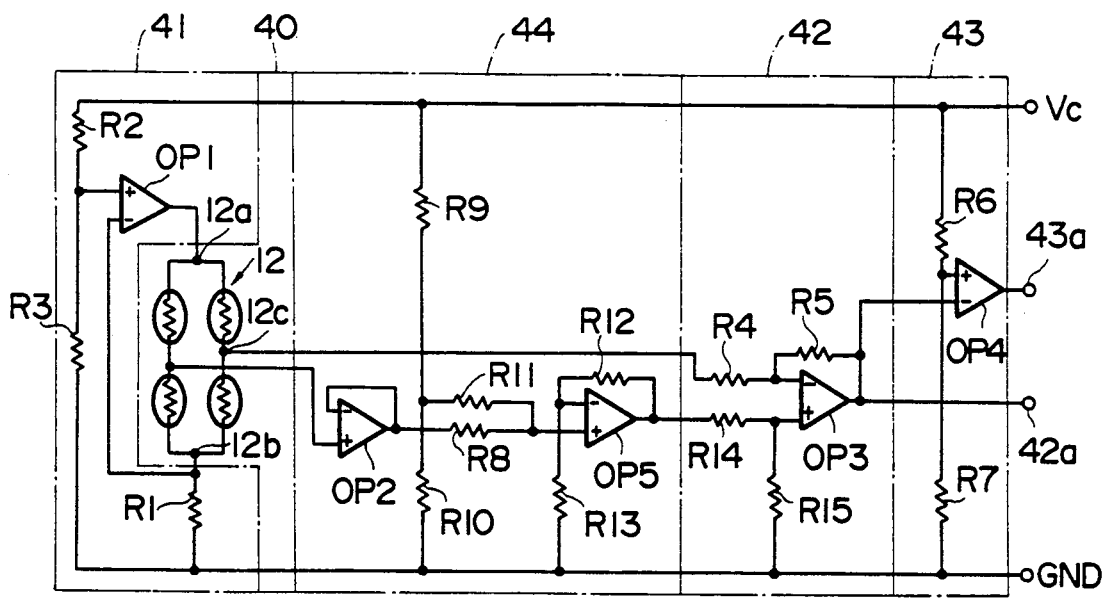
FIG. 5 is a circuit diagram of the first embodiment.

The rotational angle sensor of the above-described embodiment may be applied to various devices including a throttle position sensor for an internal combustion engine, which will be described later. FIG. 5 shows an embodiment of a detection circuit which is connected to the magnetic sensor 10 disposed in the throttle position sensor 1 in FIGS. 18, 19, and which comprises a bridge circuit 40, a constant-current circuit 41, a differential amplifying circuit 42, a comparing circuit 43 and a level shift circuit 44.

In the bridge circuit 40, there is formed a bridge by the four blocks of magnetoresistance element of the detecting element 12 shown in FIG. 2. The terminal 12a is connected to the constant-current circuit 41, while the terminal 12b is grounded through a resistor R1. The constant-current circuit 41 has an operational amplifier OP1, in a feed-back circuit of which the bridge circuit 40 is disposed. The resistor R1 is connected at its one end to the inversion input terminal of the operational amplifier OP1, and grounded at the other end. A series circuit of the resistors R2, R3 is connected to a power source Vc, and the connection point between the resistor R2 and the resistor R3 is connected to a non-inversion input terminal of the operational amplifier OP1. Thus, the constant voltage provided by the power source Vc is divided by the resistors R2 and R3 to be input to the operational amplifier OP1 as a reference voltage Vs. Accordingly, the voltage across both ends of the resistor R1 is determined by the reference voltage Vs, so that the output voltage of the operational amplifier OP1 is varied depending upon the change in ohmic value of the bridge circuit 40 as a whole to feed a constant-current thereto. Namely, the constant-current is fed to the bridge circuit 40 even if each ohmic value of the blocks of the magnetoresistance element forming the bridge circuit 40 is varied.

The output terminal 12c of the bridge circuit 40 is connected to an inversion input terminal of an operational amplifier OP3 in the differential amplifying circuit 42 through a resistor R4. An output terminal for the operational amplifier OP3 is connected not only to the inversion input terminal thereof through a feed-back resistor R5, but also to an output terminal 42a and an inversion input terminal of an operational amplifier OP4. The connection point between resistors R6 and R7 is connected to a non-inversion input terminal of the operational amplifier OP4 in the comparing circuit 43, so that the constant voltage of the power source Vc is divided by the resistors R6 and R7 to be input as a reference voltage Vp. Thus, the reference voltage Vp is compared with the output of the operational amplifier OP3 in the operational amplifier OP4, and a result of comparison is output from an output terminal 43a. Between the bridge circuit 40 and the differential amplifying circuit 42, there is disposed the level shift circuit 44 which includes an operational amplifier OP5 connected to the output terminal 12d of the bridge circuit 40 through an operational amplifier OP2. Namely, a non-inversion input terminal of an operational amplifier OP2 is connected to the output terminal 12d of the bridge circuit 40 and its output terminal is connected to a non-inversion input terminal of the operational amplifier OP5 through a resistor R8. The output terminal of the operational amplifier OP2 is fed back to its inversion input terminal to function as a buffer. The constant voltage of the power source Vc is divided by resistors R9 and R10, a connection point of which is connected to the non-inversion input terminal of the operational amplifier OP5 through a resistor R11. An inversion input terminal of the operational amplifier OP5 is fed back from an output terminal thereof through a resistor R12 and is grounded through a resistor R13. An output terminal of the operational amplifier OP5 is connected to the operational amplifier OP3 through a resistor R14 which is connected to an end of a resistor R15 the other end of which is grounded.

The output of the differential amplifying circuit 42 is provided as a rotational angle signal output from the output terminal 42a, while a rotational position signal is output from the output terminal 43a through the comparing circuit 43. The rotational angle signal is a voltage output proportional to the rotational angle of the shaft 2 and may be used for a throttle opening angle signal of a throttle valve of an internal combustion engine, for example. Also, the rotational position signal is a voltage output which indicates an ON condition turned from an OFF condition when the shaft 2 is rotated to a predetermined position, and may be used for an idle signal representing that the throttle valve comes to be at its closed position. The differential amplifying circuit 42 may be formed to provide only either one of these outputs.

In accordance with the present embodiment as mentioned above, the ohmic value of the detecting element 12 of the magnetic sensor 10 is varied in response to rotation of the shaft 2. As shown in FIG. 5. the bridge circuit 40 includes the detecting element 12, and the constant current is fed to the bridge circuit 40 through the constant-current circuit 41. Thus, an unbalanced potential arises between the connection points of the blocks of the magnetoresistance element, or between the terminals 12c and 12d in the bridge circuit 40 according to the change in ohmic value of each block of the detecting element 12. This potential is input into the differential amplifying circuit 42 through the level shift circuit 44 to generate the voltage output as the rotational angle signal from the output terminal 42a. That is, the obtained voltage output is increased linearly to the rotational angle except the outputs proximate to the maximum and minimum as shown in FIG. 4. Also, the output of the differential amplifying circuit 42 is compared with the predetermined voltage value by the comparing circuit 43 to provide the voltage output representing the predetermined rotational position, such as the idle signal.

Figure 6:
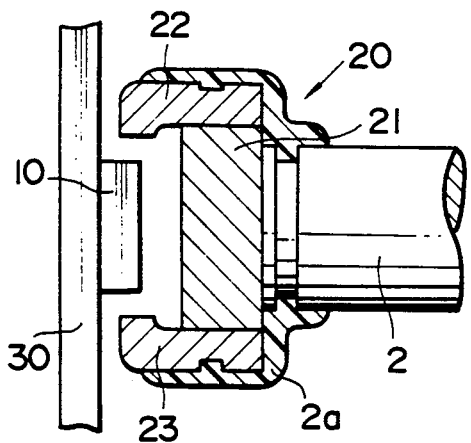
FIG. 6 is a sectional side view of another embodiment of a magneto member used for the rotational angle sensor of the first embodiment.
Figure 7:
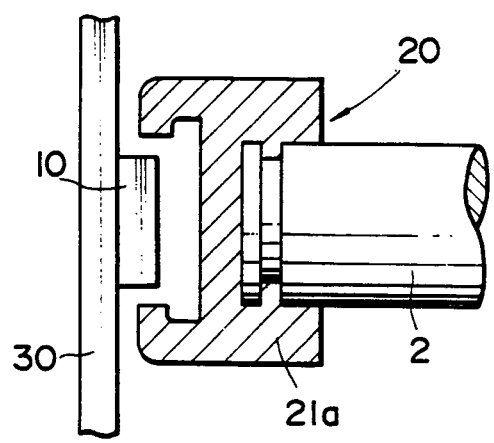
FIG. 7 is a sectional side view of a further embodiment of the/magneto member.
Figure 8:
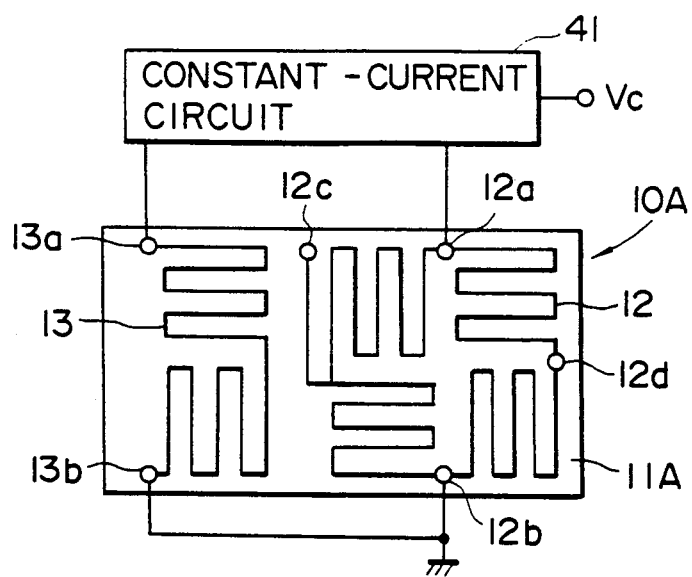
FIG. 8 is a plan view of a detecting element and a temperature compensation resistance element used for a second embodiment of the present invention.

FIG. 6 shows another embodiment of the magneto member according to the first embodiment of the present invention. In this embodiment, the magnetic arm members 22, 23 are fixed to the permanent magnet 21, and the shaft 2 is fixed to the permanent magnet 21, and then all of these are molded with resin. Further, annular grooves are formed on outer peripheral surfaces of the magnetic arm members 22, 23 and the shaft 2, so that a resin portion 2a covering these grooves is formed. FIG. 7 shows a further embodiment of the magneto member. According to this embodiment, instead of the permanent magnet 21 and the magnetic arm members 22, 23 in the aforementioned embodiments, the magneto member 20 is formed of a plastic permanent magnet 21a in one body, with the tip end of the shaft 2 embedded therein. Consequently, the magneto member in this embodiment is reduced in number of component parts, and easily manufactured.

FIGS. 8 to 12 show a second embodiment of the present invention. Fundamentally, the detecting element 12 and the magneto member 20 are essentially the same as those described in connection with FIGS. 1 to 3. In a magnetic sensor 10A according to the present embodiment, a temperature compensating resistance element 13 is deposited in the same manner as the detecting element 12 on an element substrate 11A which is larger in size than the element substrate 11 in FIG. 2 and made of the same material as the substrate 11.

Figure 9:
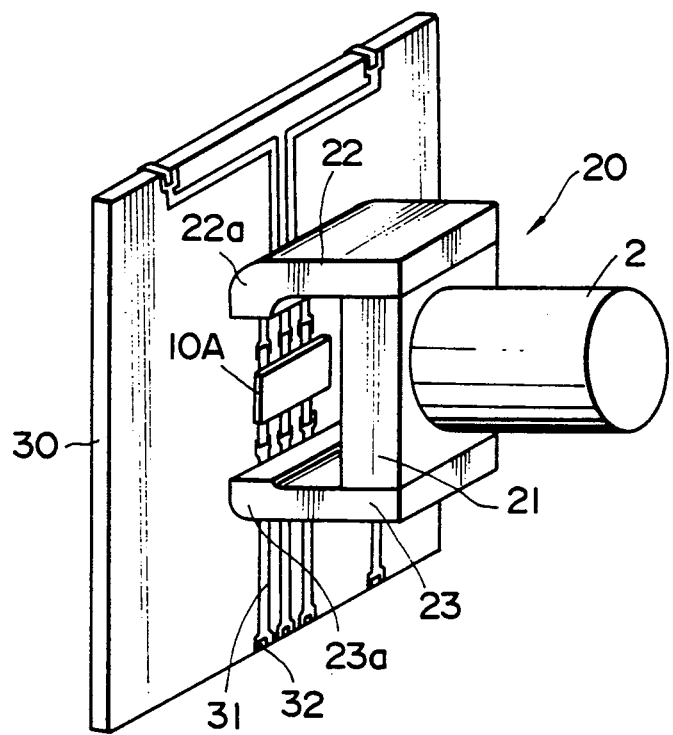
FIG. 9 is a perspective side view of the rotational angle sensor of the second embodiment.

The temperature compensating resistance element 13 of ferromagnetic alloy such as Ni-Co alloy is formed into a pattern configuration consisting of two blocks, in which a block having mainly horizontal elongated sections and a block having mainly vertical elongated sections are connected perpendicularly to each other. At both ends of the temperature compensating resistance element 13, terminals 13a, 13b are formed. The terminal 13a is connected to the power source Vc through the constant-current circuit 41, while the terminal 13b is grounded In this embodiment, the temperature compensating resistance element 13 constitutes a part of the constant-current circuit 41, as will be described later. While the temperature compensating resistance element 13 in this embodiment is deposited on the element substrate 11A together with the detecting element 12, these elements 12, 13 may be formed separately and positioned close to each other. The terminals 12a to 12d, 13a and 13b are electrically connected to a plurality of leads 31 formed on the circuit substrate 30 as shown in FIG. 9. The detecting element 12 and the temperature compensating resistance element 13 are electrically connected to the components mounted on the reverse side of the circuit substrate 30, through the leads 31 and terminals 32. Then, the magneto member 20 is disposed at a certain position relative to the magnetic sensor 10A and the circuit substrate 30 as shown in FIG. 9.

Since the magnetic sensor 10A is located in the uniform parallel magnetic field formed between the tip ends 22a, 23a of the magneto member 20, with the planar surface of the element substrate 11A positioned in parallel with the magnetic field, the uniform magnetic flux parallel with the planar surface is applied to the magnetoresistance elements constituting the detecting element 12 and the temperature compensating resistance element 13. When the permanent magnet 21 rotates around the magnetic sensor 10A in response to rotation of the shaft 2, the output of the terminals 12c, 12d of the detecting element 12 is obtained in a substantially sinusoidal wave form as described before. On the other hand, since the temperature compensating resistance element 13 has the pattern configuration consisting of two blocks of magnetoresistance element connected perpendicularly to each other, their changes in ohmic value in accordance with the rotation of the shaft 2 are set off, so that the change in ohmic value as a whole element is made as small as negligible.

Figure 10:
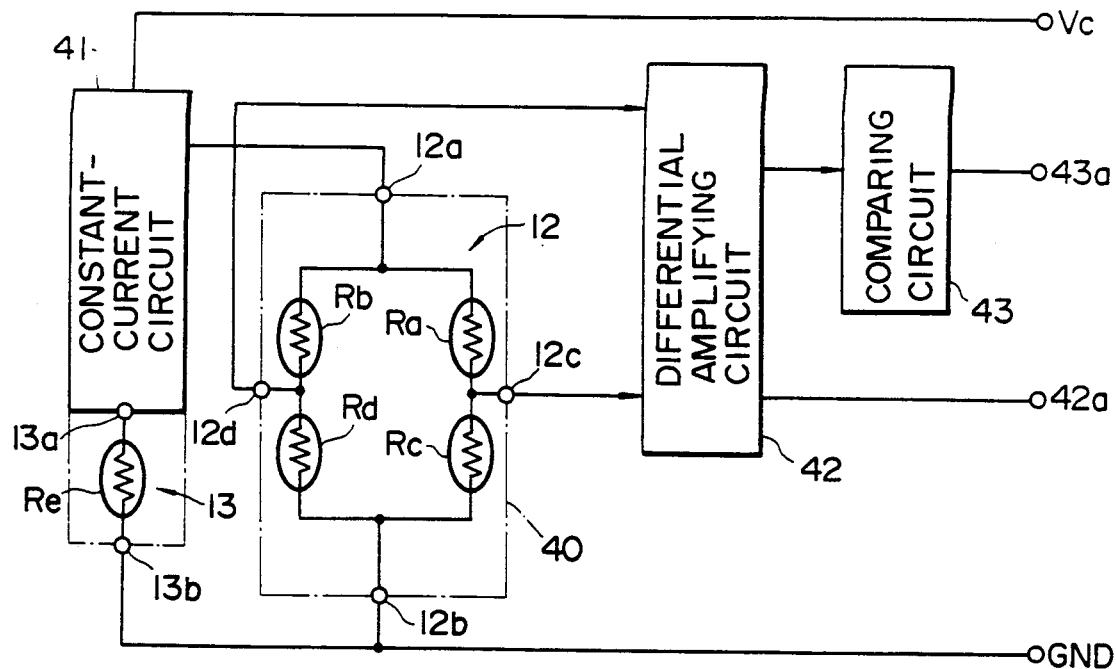
FIG. 10 is a block diagram of the second embodiment of the present invention.

FIG. 10 shows a block diagram illustrating an embodiment of a detection circuit connected to the magnetic sensor 10A. In the bridge circuit 40, the resistors equivalent to the aforementioned four blocks are represented by resistors Ra to Rd. The terminal 12a is connected to the constant-current circuit 41, while the terminal 12b is grounded. The constant-current circuit 41 which is connected to the power source Vc, is connected to the terminal 13a of the temperature compensating resistance element 13, the terminal 13b of which is grounded A resistor Re shown in FIG. 10 represents a resistor equivalent to the temperature compensating resistance element 13, and constitutes a part of the constant-current circuit 41 at the same time. The terminals 12c, 12d serve as output terminals of the bridge circuit 40, and are respectively connected to the differential amplifying circuit 42. Then, the output of the differential amplifying circuit 42 is provided as a rotational angle signal from its output terminal 42a, while a rotational position signal is output from its output terminal 43a through the comparing circuit 43. The rotational angle signal is a voltage output proportional to the rotational angle of the shaft 2, and the rotational position signal is a voltage output which indicates an ON condition turned from an OFF condition for example when the shaft 2 is rotated to a predetermined position.

When each ohmic value of the resistors Ra to Rd is varied in response to a change in ambient temperature of the detecting element 12, the ohmic value of the resistor Re of the temperature compensating resistance element 13 is similarly varied. Therefore, when each ohmic value of the resistors Ra to Rd is increased for example and the output of the bridge circuit 40 tends to be reduced, the current fed to the bridge circuit 40 from the constant-current circuit 41 is controlled to be increased according to the increase in ohmic value of the resistor Re. Consequently, the output of the bridge circuit 40 corresponds only to the rotational angle of the shaft 2 without being affected by the change in ambient temperature.

Figure 11:
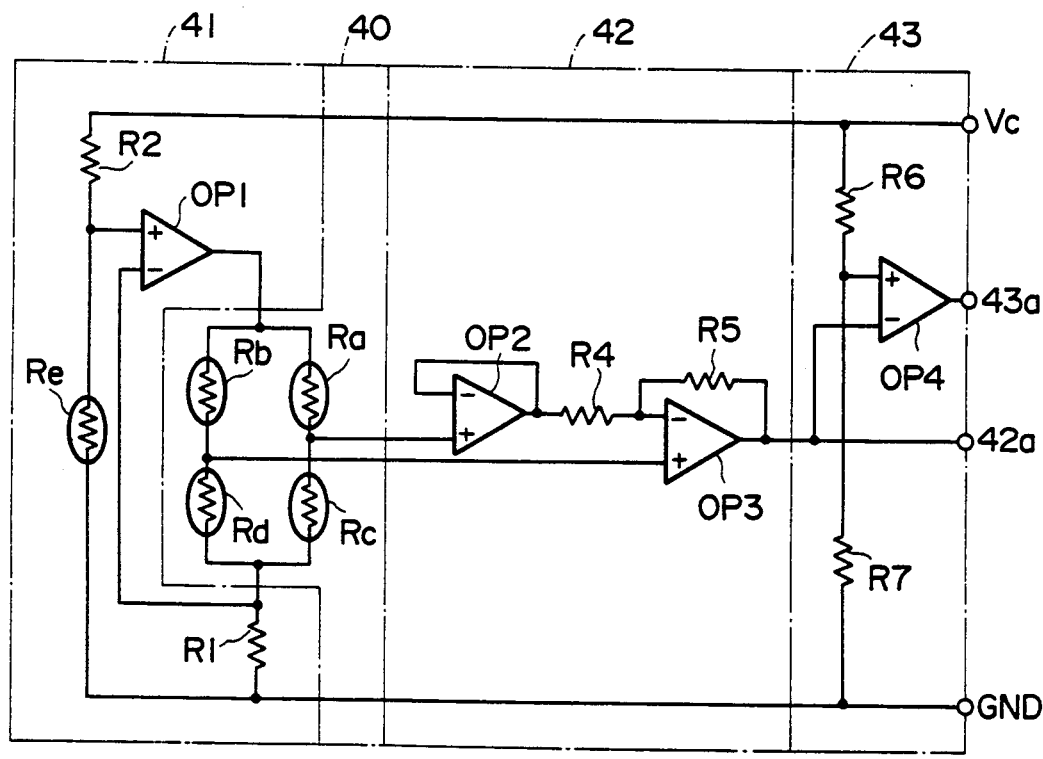
FIG. 11 is a detailed circuit diagram of the second embodiment.

FIG. 11 shows a specific circuit of the block diagram in FIG. 10. The circuit shown in FIG. 11 is substantially the same as the circuit shown in FIG. 5, except that the circuit in FIG. 11 is not provided with the level shift circuit 44 and that the resistor Re equivalent to the temperature compensating resistance element 13 is provided instead of the resistor R3 in the constant-current circuit 41 shown in FIG. 5. Accordingly, the bridge circuit 40 is connected to the operational amplifier OP3 through a buffer of the operational amplifier OP2. The remaining components of the circuit are substantially the same as those described in FIG. 5 having the same reference numerals, so that the description thereof will be omitted.

Since fundamental operation of the above-described second embodiment is substantially the same as that of the first embodiment shown in FIG. 5, the specific operation of the second embodiment in the case where the ambient temperature rises is described hereinafter. When the ambient temperature of the magnetic sensor 10A rises to increase the ohmic value of the resistor Re of the temperature compensating resistance element 13 having a positive temperature coefficient, the input voltage applied to the non-inversion input terminal of the operational amplifier OP1 is increased. Thus, the output voltage of the operational amplifier OP1 is increased, so that the current fed to the bridge circuit 40 is increased. Although each ohmic value of the resistors Ra to Rd forming the bridge circuit 40 which are under the approximately same environment as the resistor Re, is increased similarly to that of the resistor Re, the current fed from the operational amplifier OP1 to the bridge circuit 40 is increased as mentioned above, so that the output corresponding to the rotational angle is ensured without decreasing the output due to the rise of the ambient temperature.

Figure 12A:
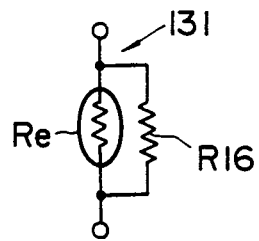
FIG. 12(a) and FIG. 12(b) are circuit diagrams of the embodiments of the temperature compensating resistance element used for the second embodiment.
Figure 12B:
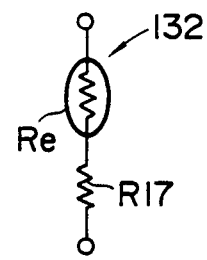

FIG. 12 shows other embodiments of a voltage divider for setting the reference voltage in the constant-current circuit 41. In FIG. 12(a), a resistor R16 is connected in parallel with the resistor Re of the temperature compensating resistance element 13, so that the voltage divider is formed by a resultant resistor 131 of the resistors Re and R16. Also, in FIG. 12(b), a resistor R17 is connected in series with the resistor Re, so that the voltage divider is formed by a resultant resistor 132 of the resistors R17 and Re. Since the resistor Re is able to set a reference voltage for the operational amplifier OP1 with the resistor R16 or R17, either of the voltage dividers shown in FIG. 12(a) and FIG. 12(b) may be properly selected depending upon the adjusting condition. If a certain temperature compensating resistance element 13 is used for the magnetic sensor 10A shown in FIGS. 8 and 9, for example, and the resistor R16 or R17 in the constant-current circuit 41 is adjusted finely by means of trimming or the like, the constant-current circuit 41 will be easily adjusted with the bridge circuit 40.

Figure 13:
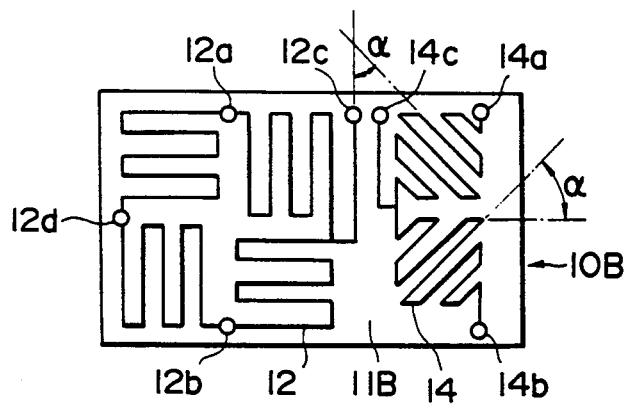
FIG. 13 is a plan view of detecting elements used for a third embodiment of the present invention.

FIGS. 13 to 17 show a third embodiment of the present invention. Fundamentally, the detecting element 12 and the magneto member 20 are essentially the same as those described in connection with FIGS. 1 to 3. The present embodiment further includes a detecting element 14 having two blocks of magnetoresistance element formed into a second pattern, while the detecting element 12 has four blocks of magnetoresistance element formed into a first pattern. The detecting elements 12 and 14 are deposited on an element substrate 11B, which is larger in size than the element substrate 11 in FIG. 2 and made of the same material as the element substrate 11, in the same manner as the detecting element 12 deposited on the element substrate 11 in FIG. 2 as described before. The detecting element 14 includes two blocks of magnetoresistance element made of the same material as the detecting element 12 having a plurality of elongated sections arranged in parallel with and connected to each other respectively, one block of which is deflected by a certain angle α from the horizontal direction, and the other block of which is deflected by the angle α from the vertical direction as shown in FIG. 13. That is, the elongated sections of each of the two blocks in the second pattern are arranged perpendicularly to each other, and deflected by the angle α from the elongated sections of the first pattern of the detecting element 12. The angle α is preferably set to be around 40° rather than 45°. At both ends and the middle of the detecting element 14, there are formed terminals 14a, 14b and 14c. The terminal 14a is connected to the power source Vc through the above-described constant-current circuit, while the terminal 14b is grounded. The terminal 14c is an output terminal from which a detection signal is output.

Figure 14:
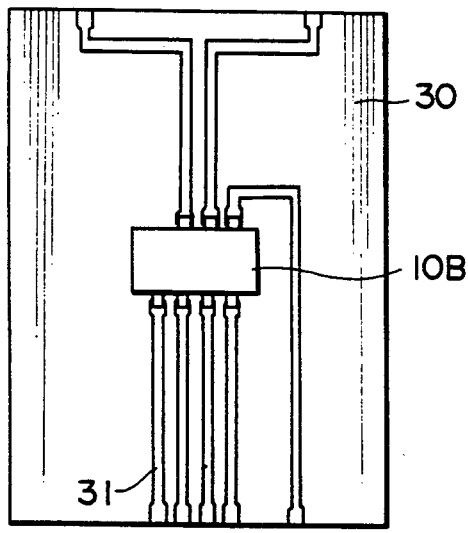
FIG. 14 is a plan view of a circuit substrate having a magnetic sensor thereon used for the third embodiment of the present invention.
Figure 15:
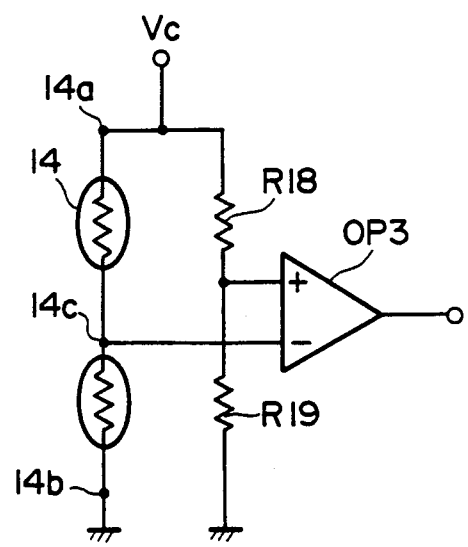
FIG. 15 is a circuit diagram of a bridge circuit for the third embodiment of the present invention.

Thus, a magnetic sensor 10B is formed and the terminals 12a to 12d, 14a and 14b are electrically connected to a plurality of leads 31 deposited on the circuit substrate 30 as shown in FIG. 14. The detecting elements 12, 14 in the magnetic sensor 10B are, therefore, electrically connected to the components mounted on the reverse side of the circuit substrate 30 through the leads 31. The remaining structure including the magneto member 20 which is disposed at a certain position relative to the magnetic sensor 10B is substantially the same as that disclosed in FIGS. 1 and 3. As shown in FIG. 15, the detecting element 14 forms with resistors R18 and R19 a bridge which is connected to the operational amplifier OP3 in the differential amplifying circuit 42 shown in FIG. 5. Other components corresponding to those in the circuit shown in FIG. 5 are omitted in FIG. 15 for simplicity. Accordingly, when the magnetic sensor 10B and the magneto member 20 are disposed in the throttle position sensor 1 as shown in FIGS. 18 and 19, the detecting element 12 is used for detecting the throttle opening angle and the detecting element 14 is used for detecting the idle region.

Figure 18:
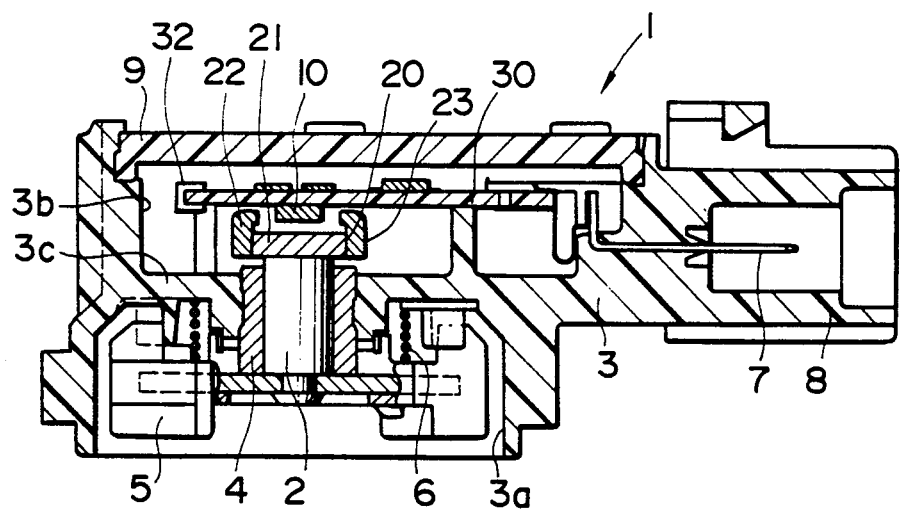
FIG. 18 is a sectional side view of a throttle position sensor including one of the embodiments of the rotational angle sensor according to the present invention.
Figure 19:
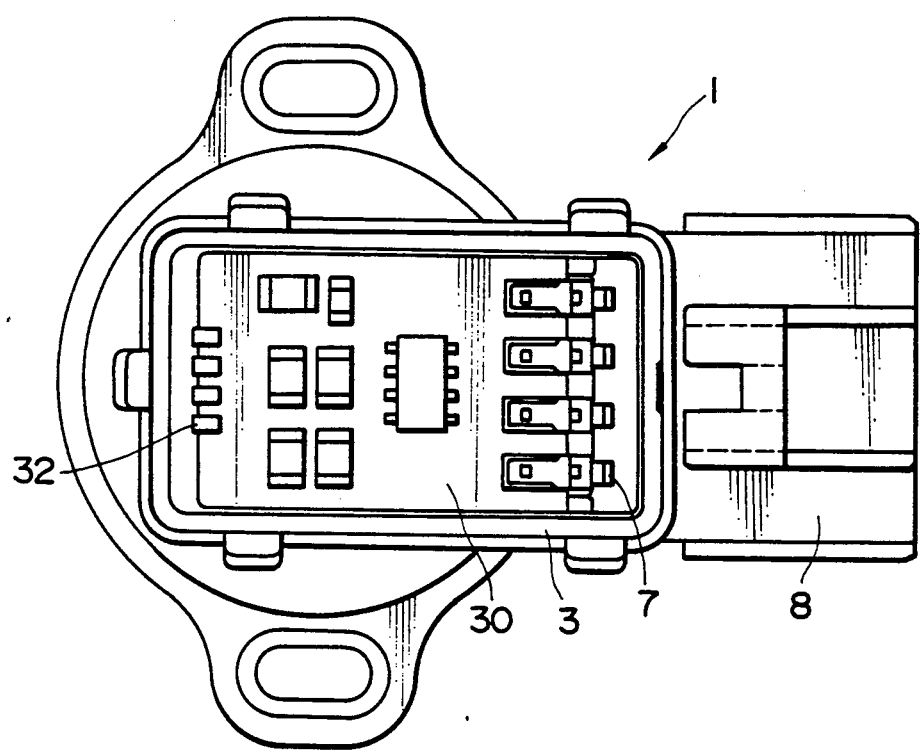
FIG. 19 is a plan view of the throttle position sensor shown in FIG. 18.

FIGS. 18 and 19 show a throttle position sensor 1 having one of the rotational angle sensors shown in FIGS. 1 to 3, FIGS. 8, 9 and FIGS. 13, 14. The throttle position sensor 1 is mounted on a throttle body (not shown), and the shaft 2 is supported so as to rotate in accordance with rotation of a throttle shaft (not shown). The throttle position sensor 1 is provided with a housing 3 made of synthetic resin having two recesses 3a, 3b separated by a partition wall 3c, and the shaft 2 is rotatably supported by the partition wall 3c through a bearing 4. A sintered oilless bearing is used for the bearing 4 in this embodiment, while ball bearings or the like may be used. A lever 5 is received in the recess 3a of the housing 3 and fixed to one end of the shaft 2. The lever 5 is arranged to be connected to the throttle shaft (not shown). A return spring 6 is interposed between the housing 3 and the lever 5 to bias the lever 5 toward a predetermined initial position. Accordingly, in response to opening operation of the throttle valve (not shown), the lever 5 rotatable with the throttle shaft is driven against the biasing force of the return spring 6 so as to rotate the shaft 2.

The magneto member 20 is fixed to the other end of the shaft 2 to be received in the other recess 3b of the housing 3. The magnetic sensor 10 is disposed so as to face the permanent magnet 21 of the magneto member 20 and positioned between the magnetic arm members 22, 23 which is fixed to both ends of the permanent magnet 21. As mentioned above, the magnetic sensor 10 includes the element substrate 11 and the detecting element 12 deposited thereon, and is disposed on a surface of the circuit substrate 30. On the reverse side of the circuit substrate 30, there are disposed components such as the operational amplifier OP1 and etc. constituting the detection circuit. The circuit substrate 30 is provided at one end thereof with a plurality of terminals 32 interconnecting the leads deposited on the top and reverse sides, and is connected at the other end thereof to a plurality of lead members 7. These lead members 7 are embedded in the housing 3 and extend laterally to form a connector 8 integrally with the housing 3. The circuit substrate 30 is received in the recess 3b of the housing 3, and fixed thereto. Then, the recess 3b is enclosed by a cover 9 made of synthetic resin.

According to the throttle position sensor 1 provided with one of the aforementioned rotational angle sensors, when the lever 5 is driven in response to rotation of the throttle valve (not shown), and the shaft 2 is rotated around the bearing 4, not only the rotational angle signal of the throttle valve or the throttle opening signal is produced, but also the idle signal is produced at the same time. In operation of the throttle position sensor 1, if the shaft 2 is displaced in the axial direction thereof due to the supporting structure or the like of the shaft 2, or displaced in the parallel direction with the planar surface of the magnetic sensor 10 due to an offset of the shaft 2, the magneto member 20 will be displaced relative to the magnetic sensor 10. However, since the magnetic field formed between the tip ends 22a, 23a provides the uniform parallel magnetic flux, the magnetic flux applied to the detecting element 12 is not varied. Therefore, a stable voltage signal is output from the terminals 12c, 12d without being affected by the above displacement of the shaft 2. Further, since the rotational angle sensor used in the second embodiment of the present invention may restrain errors due to the ambient temperature as mentioned above, a stable and accurate detection is ensured even under a severe external environment.

In the third embodiment of the present invention, the ohmic value of the detecting element 14 of the magnetic sensor 10 is varied in response to rotation of the shaft 2. Namely, when the magnetic arm members 22, 23 of the magneto member 20 are at their initial positions, the magnetic field of the parallel magnetic flux is applied to the detecting element 14 horizontally in FIG. 13. Thus, as shown in FIG. 16(b), the output voltage of the terminal 14c of the detecting element 14 is made below the threshold level determined by the resistors R18 and R19 shown in FIG. 15. When the magnetic field between the magnetic arm members 22, 23 is rotated with the shaft 2 rotated, the output voltage of the terminal 14c linearly rises. Then, if the rotational angle of the shaft 2 reaches the predetermined angle, the output voltage exceeds the threshold level. Thus, the electric potential of the terminal 14c varies as shown in FIG. 16(b) to obtain the output shown in FIG. 16(a) from the operational amplifier OP3 with reference to the threshold level. Thus, the throttle opening region shown by a in FIG. 16 is strictly distinguished as the idle region. On the other hand, as apparent from FIG. 17(b) where the output characteristic is shown in case of detecting the idle region by the output voltage of the detecting element 12 without using the detecting element 14, the output voltage of the detecting element 12 around a throttle opening within the idle region is not clearly distinguished from the threshold level, so that the throttle opening region a where the idle signal is to be output as shown in FIG. 17(a) becomes unstable. As has been described in the foregoings, according to the present embodiment, the throttle opening is detected by the detecting element 12 of the first pattern, and simultaneously the idle region is surely detected by the detecting element 14 of the second pattern.

It should be apparent to one skilled in the art that the above-described embodiment is merely illustrative of but a few of the many possible specific embodiments of the present invention. Numerous and various other arrangements can be readily devised by those skilled in the art without departing from the spirit and scope of the invention as defined in the following claims.

What is claimed is:

1. A sensor for detecting a rotational angle of a rotating shaft comprising:
    a substrate having a planar surface, said substrate being mounted on a base plate with the planar surface of said substrate facing a magneto member, a clearance provided between said base plate and tip ends of opposite facing sides of said magneto member, said clearance being smaller than a thickness of said substrate;
    a detecting element including a plurality of blocks of magnetoresistance element deposited on the planar surface of said substrate; and
    said magneto member having a pair of magneto poles facing each side end of said substrate respectively and providing a magnetic field covering at least the planar surface of said substrate, said magneto member being substantially C-shaped so as to provide said opposite facing sides, said magnetic field provided between said opposite facing sides in which said substrate is positioned, the planar surface of said substrate positioned in parallel with the direction of magnetic flux of said magnetic field, the opposite facing sides of said magneto member for providing said magnetic field therebetween being greater than said substrate;
    wherein one of said detecting element and said magneto member is mounted on said rotating shaft, and the other thereof is disposed at a certain position relative to said rotating shaft.

2. A sensor for detecting a rotational angle of a rotating shaft comprising:
    a substrate having a planar surface;
    a detecting element including a plurality of blocks of magnetoresistance element deposited on the planar surface of said substrate, said blocks of magnetoresistance element forming a bridge circuit;
    a magneto member having a pair of magnetic poles facing each side end of said substrate respectively and providing a magnetic field covering at least the planar surface of said substrate, one of said detecting element and said magneto member being mounted on said rotating shaft, and the other thereof being disposed at a certain position relative to said rotating shaft;

a constant-current circuit for feeding a constant-current to said bridge circuit of said detecting element; and a temperature compensating resistance element comprises two blocks of magnetoresistance element of the same material as said magnetoresistance element of said detecting element disposed in the vicinity thereof, said temperature compensating resistance element adjusting a current fed to said constant-current circuit in response to a change in ohmic value of said temperature compensating resistance element varying in dependence on a change in ambient temperature thereof, the magnetoresistance element having a plurality of elongated sections arranged in parallel with and connected to each other respectively, and wherein the elongated sections of said blocks are arranged perpendicularly to each other.

3. A sensor as set forth in claim 2, wherein said magnetoresistance element provided for said temperature compensating resistance element is deposited on the same substrate as said substrate of said detecting element.

4. A sensor as set forth in claim 2, wherein said temperature compensating resistance element further comprises a resistor connected to said magnetoresistance element provided for said temperature compensating resistance.

5. A sensor as set forth in claim 3, wherein said constant-current circuit includes an operational amplifier and a feedback circuit connected thereto, and wherein said detecting element is disposed in said feedback circuit, and said temperature compensating resistance element is disposed as a voltage divider in a circuit connected to said operational amplifier and grounded for providing a reference voltage.

6. A sensor for detecting a rotational angle of a rotating shaft comprising:

a substrate having a planar surface;

a detecting element including four blocks of magnetoresistance element formed into a first pattern and deposited on the planar surface of said substrate, each block thereof having a plurality of elongated sections arranged in parallel with and connected to each other, and the elongated sections of the block next to each other of said blocks being arranged perpendicularly to each other, and wherein said detecting element further includes two blocks of magnetoresistance element formed into a second pattern, each block thereof having a plurality of elongated sections arranged in parallel with and connected to each other, the elongated sections of each of said two blocks being arranged perpendicularly to each other, and said elongated sections in said second pattern being deflected from said elongated sections of said first pattern; and a magneto member having a pair of magnetic poles facing each side end of said substrate respectively and providing a magnetic field covering at least the planar surface of said substrate;

wherein one of said detecting element and said magneto member is mounted on said rotating shaft, and the other thereof is disposed at a certain position relative to said rotating shaft, and wherein said blocks of magnetoresistance element of said detecting element have a plurality of elongated sections arranged in parallel with and connected to each other respectively, with said elongated sections deflected by said magnetic field provided by said magneto member at an initial position thereof.

7. A sensor as set forth in claim 6, wherein said second pattern of magnetoresistance element is deposited on said substrate in the vicinity of said first pattern of magnetoresistance element.

8. A sensor as set forth in claim 6, wherein said rotating shaft is connected to a throttle valve of an internal combustion engine and rotates in response thereto, and wherein the elongated sections of said second pattern of magnetoresistance element are deflected from the direction of magnetic flux of said magnetic field provided by said magneto member when said throttle valve is at a closed position thereof.

* * * * *